(12) United States Patent
Khlat (10) Patent No.: US 12,224,711 B2
(45) Date of Patent: Feb. 11, 2025

(54) TARGET VOLTAGE GENERATION IN AN ENVELOPE TRACKING INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 564 days.

(21) Appl. No.: 17/523,966

(22) Filed: Nov. 11, 2021

(65) Prior Publication Data

US 2022/0360225 A1   Nov. 10, 2022

Related U.S. Application Data

(60) Provisional application No. 63/185,948, filed on May 7, 2021.

(51) Int. Cl.
*H03F 1/02* (2006.01)
*H03F 3/19* (2006.01)

(52) U.S. Cl.
CPC ............ *H03F 1/0216* (2013.01); *H03F 3/19* (2013.01); *H03F 2200/105* (2013.01); *H03F 2200/375* (2013.01); *H03F 2200/451* (2013.01)

(58) Field of Classification Search
CPC .................................................. H03F 1/0216
See application file for complete search history.

(56) References Cited

U.S. PATENT DOCUMENTS

| | | | |
|---|---|---|---|
| 8,154,341 B2 | 4/2012 | Ishikawa et al. | |
| 11,349,436 B2 | 5/2022 | Khlat | |
| 11,973,469 B2 * | 4/2024 | Retz | H03F 1/56 |
| 2012/0163632 A1 * | 6/2012 | Lesso | H02M 3/072 |
| | | | 327/536 |
| 2012/0170770 A1 * | 7/2012 | Lesso | H02M 3/07 |
| | | | 327/536 |
| 2016/0164551 A1 * | 6/2016 | Khlat | H03F 3/19 |
| | | | 330/297 |
| 2018/0241347 A1 * | 8/2018 | Petrovic | H04B 1/0475 |

(Continued)

OTHER PUBLICATIONS

Notice of Allowance for U.S. Appl. No. 17/523,957, mailed Jan. 13, 2023, 9 pages.

(Continued)

*Primary Examiner* — Patricia T Nguyen
(74) *Attorney, Agent, or Firm* — Withrow & Terranova, P.L.L.C.

(57) ABSTRACT

Target voltage generation in an envelope tracking (ET) integrated circuit (ETIC) is provided. The ETIC is configured to generate a time-variant ET voltage based on a time-variant target voltage for amplifying a radio frequency (RF) signal modulated for communication in multiple time intervals. In embodiments disclosed herein, the ETIC is self-contained to generate the time-variant target voltage based on a sensed signal having a time-variant sensed envelope that tracks a time-variant power envelope of the RF signal. Since the time-variant target voltage is generated to track the time-variant sensed envelope, which further tracks the time-variant power envelope, the time-variant ET voltage can better track the time-variant power envelope of the RF signal when the time-variant ET voltage is provided to a power amplifier(s) that amplifies the RF signal.

20 Claims, 6 Drawing Sheets

(56) References Cited

U.S. PATENT DOCUMENTS

2018/0331659 A1* 11/2018 Khesbak ................. H03F 3/245
2020/0304082 A1*  9/2020 Henzler ................ H03F 1/0222
2021/0194517 A1   6/2021 Mirea et al.
2022/0286094 A1*  9/2022 Granger-Jones ...... H03F 1/0222

OTHER PUBLICATIONS

Non-Final Office Action for U.S. Appl. No. 17/523,985, mailed Apr. 25, 2024, 8 pages.
Notice of Allowance for U.S. Appl. No. 17/507,173, mailed Apr. 10, 2024, 9 pages.
U.S. Appl. No. 17/523,999, filed Nov. 11, 2021.
U.S. Appl. No. 17/523,985, filed Nov. 11, 2021.
U.S. Appl. No. 17/523,957, filed Nov. 11, 2021.
U.S. Appl. No. 17/507,173, filed Oct. 21, 2021.
Non-Final Office Action for U.S. Appl. No. 17/523,999, mailed Aug. 29, 2024, 12 pages.
Notice of Allowance for U.S. Appl. No. 17/523,985, mailed Sep. 3, 2024, 8 pages.

* cited by examiner

TARGET VOLTAGE GENERATION IN AN ENVELOPE TRACKING INTEGRATED CIRCUIT

RELATED APPLICATIONS

This application claims the benefit of U.S. provisional patent application Ser. No. 63/185,948 filed on May 7, 2021, the disclosure of which is hereby incorporated herein by reference in its entirety.

FIELD OF THE DISCLOSURE

The technology of the disclosure relates generally to an envelope tracking (ET) power management circuit.

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz (e.g., 1 GHz).

The duration of an OFDM symbol depends on the SCS and the modulation bandwidth. The table below (Table 1) provides some OFDM symbol durations, as defined by 3G partnership project (3GPP) standards for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 μs. Accordingly, a transition settling time between two consecutive OFDM symbols will be less than or equal to the CP duration of 0.59 μs.

TABLE 1

| SCS (KHz) | CP (μs) | OFDM Symbol Duration (μs) | Modulation Bandwidth (MHz) |
|---|---|---|---|
| 15 | 4.69 | 71.43 | 50 |
| 30 | 2.34 | 35.71 | 100 |
| 60 | 1.17 | 17.86 | 200 |
| 120 | 0.59 | 8.93 | 400 |

TABLE 1-continued

In the 5G-NR system, the RF signal is communicated in a millimeter wave (mmWave) spectrum that is typically above 6 GHz. Notably, the RF signal transmitted in the mmWave spectrum may be more susceptible to propagation attenuation and interference that can result in substantial reduction in data throughput. To help mitigate propagation attenuation and maintain desirable data throughput, power amplifiers are typically employed in a wireless communication device (e.g., smartphone) to amplify the RF signal before transmitting in the mmWave spectrum.

Envelope tracking (ET) is a power management technique designed to improve operating efficiency of the power amplifiers. To support ET in the wireless communication device, an ET integrated circuit (ETIC) is typically employed to generate a time-variant ET voltage that closely tracks a time-variant power envelope of the RF signal. The power amplifiers, in turn, are configured to amplify the RF signal based on the time-variant ET voltage. Understandably, the closer the time-variant ET voltage tracks the time-variant power envelope, the higher the efficiency can be achieved at the power amplifiers.

SUMMARY

Embodiments of the disclosure relate to target voltage generation in an envelope tracking (ET) integrated circuit (ETIC). The ETIC is configured to generate a time-variant ET voltage based a time-variant target voltage for amplifying a radio frequency (RF) signal modulated for communication in multiple time intervals. In embodiments disclosed herein, the ETIC is self-contained to generate the time-variant target voltage based on a sensed signal having a time-variant sensed envelope that tracks a time-variant power envelope of the RF signal. Since the time-variant target voltage is generated to track the time-variant sensed envelope, which further tracks the time-variant power envelope, the time-variant ET voltage can better track the time-variant power envelope of the RF signal when the time-variant ET voltage is provided to a power amplifier(s) that amplifies the RF signal.

In one aspect, an ETIC is provided. The ETIC includes an ET voltage circuit. The ET voltage circuit is configured to generate a time-variant ET voltage based on a time-variant target voltage for amplifying an RF signal in multiple time intervals. The ET voltage circuit is also configured to generate a sensed signal having a time-variant sensed envelope that tracks a time-variant power envelope of the RF signal. The ETIC also includes a target voltage generation circuit. The target voltage generation circuit is configured to generate the time-variant target voltage based on the time-variant sensed envelope to thereby cause the time-variant ET voltage to track the time-variant power envelope of the RF signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to target voltage generation in an envelope tracking (ET) integrated circuit (ETIC). The ETIC is configured to generate a time-variant ET voltage based a time-variant target voltage for amplifying a radio frequency (RF) signal modulated for communication in multiple time intervals. In embodiments disclosed herein, the ETIC is self-contained to generate the time-variant target voltage based on a sensed signal having a time-variant sensed envelope that tracks a time-variant power envelope of the RF signal. Since the time-variant target voltage is generated to track the time-variant sensed envelope, which further tracks the time-variant power envelope, the time-variant ET voltage can better track the time-variant power envelope of the RF signal when the time-variant ET voltage is provided to a power amplifier(s) that amplifies the RF signal.

Figure 1:
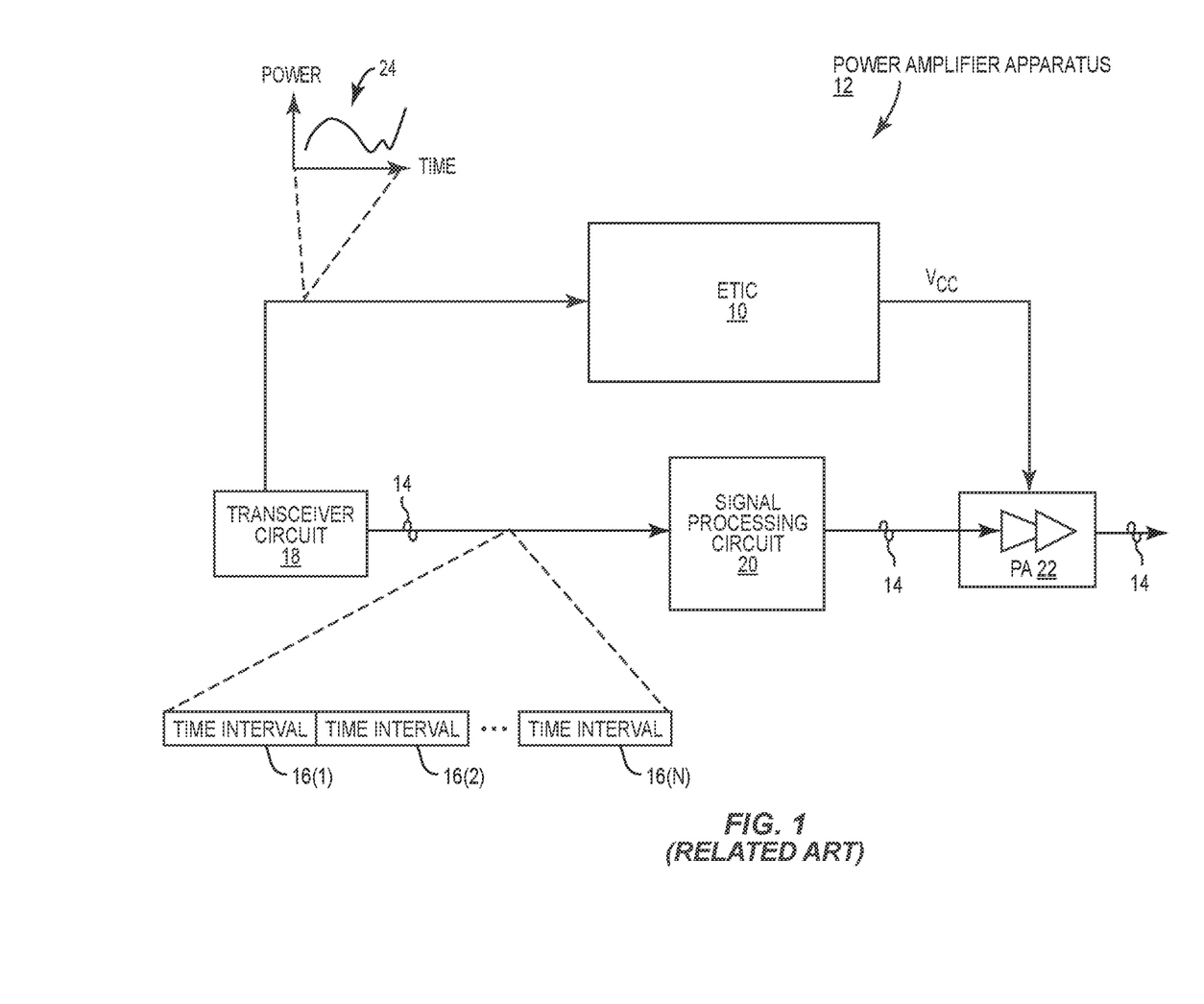
FIG. 1 is a schematic diagram of an exemplary existing envelope tracking (ET) integrated circuit (ETIC) provided in a power amplifier apparatus.
Figure 2:
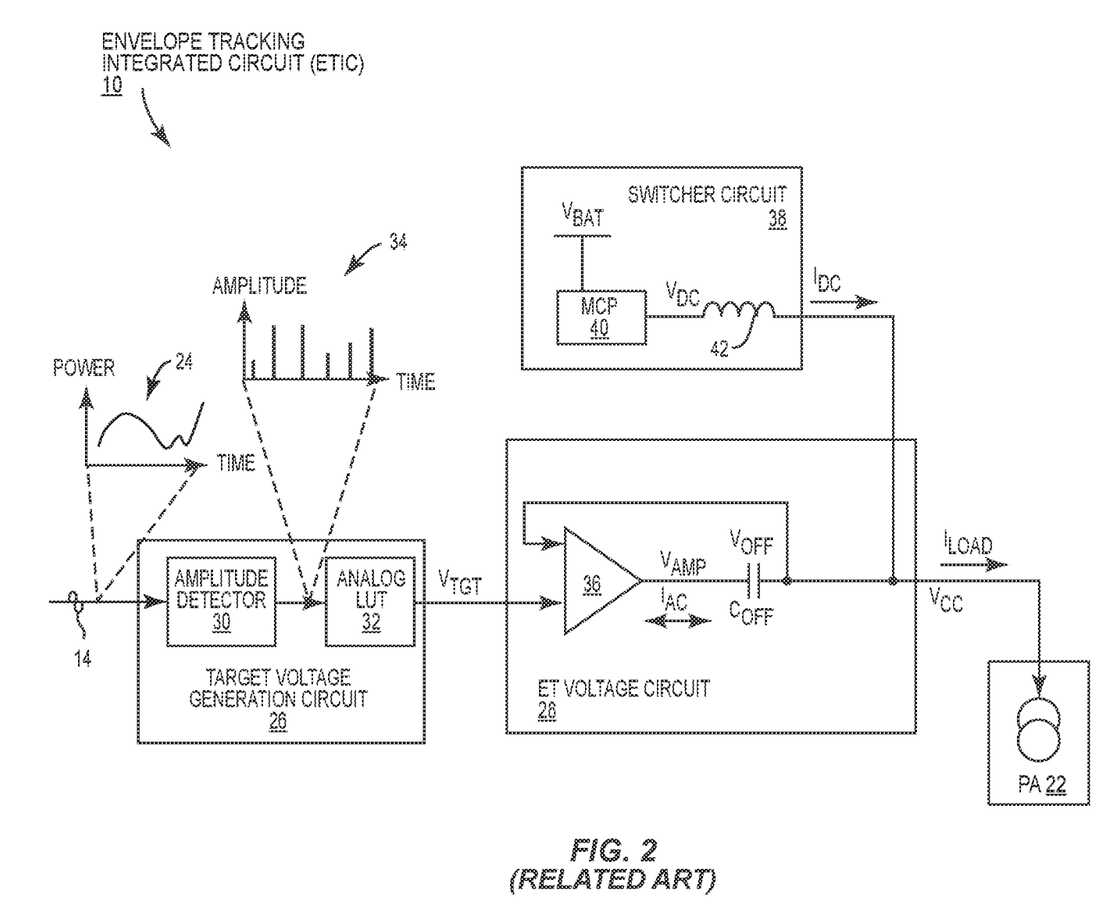
FIG. 2 is a schematic diagram of the existing ETIC in FIG. 1 configured to generate a time-variant ET voltage.
Figure 3:
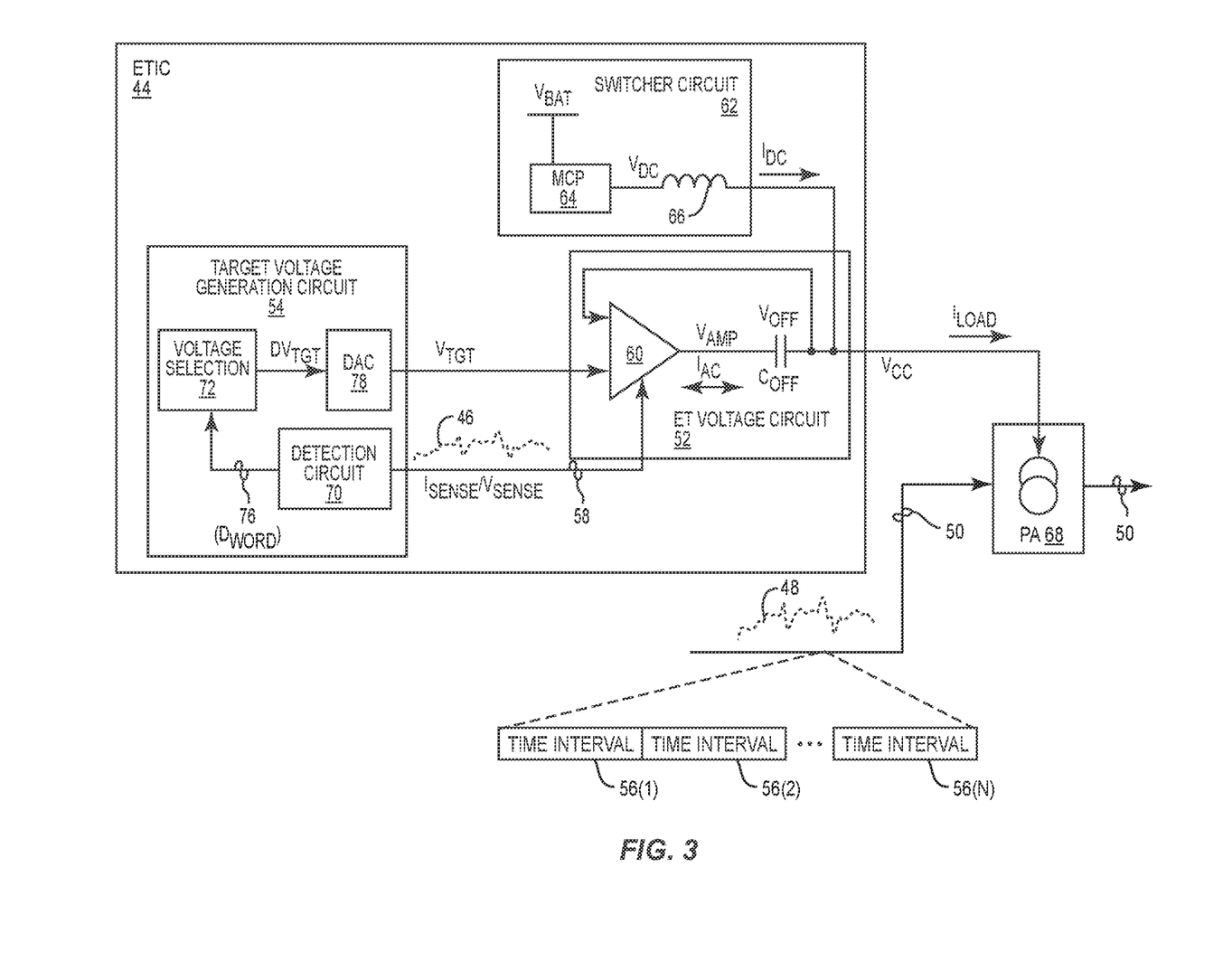
FIG. 3 is a schematic diagram of an exemplary ETIC configured according to an embodiment of the present disclosure to generate a time-variant target voltage based on a time-variant sensed envelope that tracks a time-variant power envelope of a radio frequency (RF) signal.

Before discussing target voltage generation in an ETIC according to the present disclosure, starting at FIG. 3, an overview of target voltage generation in an existing ETIC is first provided with reference to FIGS. 1 and 2.

FIG. 1 is a schematic diagram of an exemplary existing ETIC 10 provided in a power amplifier apparatus 12 and configured to generate a time-variant variant ET voltage $V_{CC}$ for amplifying an RF signal 14 modulated for transmission in multiple time intervals 16(1)-16(N). The power amplifier apparatus 12 includes a transceiver circuit 18 that is configured to generate and modulate the RF signal 14 in the time intervals 16(1)-16(N) in any modulation bandwidth as shown in Table 1 above. Accordingly, each of the time intervals 16(1)-16(N) can have a duration of an orthogonal frequency division multiplexing (OFDM) symbol, which is inversely related to the modulation bandwidth of the RF signal 14 according to Table 1.

The transceiver circuit 18 is configured to provide the RF signal 14 to the existing ETIC 10 and a signal processing circuit 20. In a non-limiting example, the transceiver circuit 18 can provide the RF signal 14 to the existing ETIC 10 and the signal processing circuit 20 in an intermediate frequency (IF). The signal processing circuit 20 may be configured to upconvert the RF signal 14 from the IF to an appropriate carrier frequency and provides the RF signal 14 to a power amplifier circuit 22.

The existing ETIC 10 is configured to provide the time-variant ET voltage $V_{CC}$ to the power amplifier circuit 22 for amplifying the RF signal 14 in each of the time intervals 16(1)-16(N). The existing ETIC 10 is configured to generate the time-variant ET voltage $V_{CC}$ to closely track a time-variant power envelope 24 associated with the RF signal 14. Notably, the time-variant power envelope 24 can vary (rise or fall) rapidly during each of the time intervals 16(1)-16(N). Notably, the power amplifier circuit 22 is operating as a current source to the existing ETIC 10. As a result, any misalignment between the time-variant ET voltage $V_{CC}$ and the time-variant power envelope 24 will not only reduce operation efficiency and/or linearity of the power amplifier circuit 22, but also cause some degree of distortion (e.g., amplitude clipping) to the RF signal 14. As such, it is desirable to make sure the existing ETIC 10 can adapt the time-variant ET voltage $V_{CC}$ in accordance with the time-variant power envelope 24 in each of the time intervals 16(1)-16(N).

In this regard, FIG. 2 is a schematic diagram of the existing ETIC 10 in FIG. 1 configured to generate the time-variant ET voltage $V_{CC}$ to track the time-variant power envelope 24. Common elements between FIGS. 1 and 2 are shown therein with common element numbers and will not be re-described herein.

The existing ETIC 10 includes a target voltage generation circuit 26 and an ET voltage circuit 28. The target voltage generation circuit 26 is configured to generate a time-variant target voltage $V_{TGT}$ based on the time-variant power envelope 24 associated with the RF signal 14. The ET voltage circuit 28 is configured to generate the time-variant ET voltage $V_{CC}$ based on the time-variant target voltage $V_{TGT}$.

The target voltage generation circuit 26 includes an amplitude detector circuit 30 and an analog lookup table (LUT) circuit 32. The amplitude detector circuit 30 is configured to determine a time-variant amplitude 34 based on the time-variant power envelope 24 of the RF signal 14. The analog LUT circuit 32 is configured to generate the time-variant target voltage $V_{TGT}$ based on the time-variant amplitude 34. In a non-limiting example, the analog LUT circuit 32 can include an analog LUT (not shown) that correlates the time-variant amplitude 34 with the time-variant target voltage $V_{TGT}$. Accordingly, the analog LUT circuit 32 is configured to generate the time-variant target voltage $V_{TGT}$ based on the correlation established in the analog LUT.

The ET voltage circuit 28 includes a voltage amplifier 36 and an offset capacitor $C_{OFF}$. The voltage amplifier 36 is configured to generate an initial ET voltage $V_{AMP}$ based on the time-variant voltage $V_{TGT}$. The offset capacitor $C_{OFF}$ is configured to raise the initial ET voltage $V_{AMP}$ by an offset voltage $V_{OFF}$ to thereby generate the time-variant ET voltage $V_{CC}$ ($V_{CC}=V_{AMP}+V_{OFF}$). Notably, by providing the offset capacitor $C_{OFF}$ to raise the initial ET voltage $V_{AMP}$, the voltage amplifier 36 can generate the initial ET voltage $V_{AMP}$ at a lower level than the time-variant ET voltage $V_{CC}$, thus helping to improve headroom and efficiency of the voltage amplifier 36.

The existing ETIC 10 also includes a switcher circuit 38 configured to modulate the offset voltage $V_{OFF}$ based on a battery voltage $V_{BAT}$. The switcher circuit 38 can further include a multi-level charge pump (MCP) 40 and a power inductor 42. The MCP 40 is configured to generate a low-frequency voltage $V_{DC}$ as a function of the battery voltage $V_{BAT}$ and in accordance with a duty cycle. The power inductor 42 is configured to induce a low-frequency current $I_{DC}$ to charge the offset capacitor $C_{OFF}$ to thereby modulate the offset voltage $V_{OFF}$.

As mentioned earlier, the power amplifier circuit 22 acts as a current source to the existing ETIC 10. As such, the time-variant ET voltage $V_{CC}$ will cause a time-variant load current $I_{LOAD}$ to flow through the power amplifier circuit 22. Understandably, the time-variant load current $I_{LOAD}$ can go up and down as the time-variant power envelope 24 increases and decreases. As a result, since the low-frequency current $I_{DC}$ may be constant, the voltage amplifier 36 may need to source or sink a high-frequency current $I_{AC}$ (e.g., alternating current) such that the time-variant load current $I_{LOAD}$ can closely track the time-variant power envelope 24. In other words, the high-frequency current $I_{AC}$ is correlated (e.g., lock stepped) with the time-variant power envelope 24.

As such, the high-frequency current $I_{AC}$ can be used as an indicator of the time-variant power envelope 24. In embodiments disclosed herein, an ETIC can be configured to generate a time-variant ET voltage in accordance with a time-variant envelope associated with the high-frequency current $I_{AC}$. Given that the high-frequency current $I_{AC}$ is generated internally to the ETIC, the ETIC no longer needs to receive the time-variant power envelope 24 from the transceiver circuit 18. Further, it is also not necessary to employ the amplitude detector circuit 30 to detect the time-variant amplitude 34. As a result, the ETIC can be more self-contained and simplified to help reduce cost and footprint.

In this regard, FIG. 3 is a schematic diagram of an exemplary ETIC 44 configured according to an embodiment of the present disclosure to generate a time-variant target voltage $V_{TGT}$ based on a time-variant sensed envelope 46 that tracks a time-variant power envelope 48 of an RF signal 50. In an embodiment, the ETIC 44 includes an ET voltage circuit 52 and a target voltage generation circuit 54. The ET voltage circuit 52 is configured to generate a time-variant ET voltage $V_{CC}$ based on the time-variant target voltage $V_{TGT}$ for amplifying the RF signal 50 in multiple time intervals 56(1)-56(N). In examples discussed herein, each of the time intervals 56(1)-56(N) has a duration of an OFDM symbol.

The ET voltage circuit 52 is further configured to generate a sensed signal 58 having the time-variant sensed envelope 46 that tracks the time-variant power envelope 48 of the RF signal 50. The target voltage generation circuit 54 is configured to generate the time-variant target voltage $V_{TGT}$ based on the time-variant sensed envelope 46 to thereby cause the time-variant ET voltage $V_{CC}$ to track the time-variant power envelope 48 of the RF signal 50. Since the sensed signal 58 is generated internally in the ETIC 44, the ETIC 44 can become more self-contained to generate the time-variant target voltage $V_{TGT}$ and the time-variant ET voltage $V_{CC}$ without requiring the amplitude detector circuit 30 as required in the existing ETIC 10 of FIG. 2 and relying on the transceiver circuit 18 in the power amplifier apparatus 12 of FIG. 1 to provide the time-variant power envelope 24. As a result, the ETIC 44 can be built with lower cost, smaller footprint, and reduced complexity.

The ET voltage circuit 52 includes a voltage amplifier 60 and an offset capacitor $C_{OFF}$. The voltage amplifier 60 is configured to generate an initial ET voltage $V_{AMP}$ based on the time-variant voltage $V_{TGT}$. The offset capacitor $C_{OFF}$ is configured to raise the initial ET voltage $V_{AMP}$ by an offset voltage $V_{OFF}$ to thereby generate the time-variant ET voltage $V_{CC}$ ($V_{CC}=V_{AMP}+V_{OFF}$). Notably, by providing the offset capacitor $C_{OFF}$ to raise the initial ET voltage $V_{AMP}$, the voltage amplifier 60 can generate the initial ET voltage $V_{AMP}$ at a lower level than the time-variant ET voltage $V_{CC}$, thus helping to improve headroom and efficiency of the voltage amplifier 60.

The ETIC 44 also includes a switcher circuit 62 configured to modulate the offset voltage $V_{OFF}$ based on a battery voltage $V_{BAT}$. The switcher circuit 62 can further include an MCP 64 and a power inductor 66. The MCP 64 is configured to generate a low-frequency voltage $V_{DC}$ as a function of the battery voltage $V_{BAT}$ and in accordance with a duty cycle. In a non-limiting example, the MCP 64 can generate the low-frequency voltage $V_{DC}$ at $0 \times V_{BAT}$ (0 V), $1 \times V_{BAT}$, or $2 \times V_{BAT}$ based on the duty cycle. For example, if the battery voltage $V_{BAT}$ is 5 V and the duty cycle is 30% at $0 \times V_{BAT}$ (0 V), 30% at $1 \times V_{BAT}$, and 40% at $2 \times V_{BAT}$, the MCP 64 will then generate the low-frequency voltage $V_{DC}$ at 5.5 V ($0 \times 30\% + 5 \times 30\% + 10 \times 40\%$). The power inductor 66 is configured to induce a low-frequency current $I_{DC}$ to charge the offset capacitor $C_{OFF}$ to thereby modulate the offset voltage $V_{OFF}$.

The ETIC 44 is configured to provide the time-variant ET voltage $V_{CC}$ to a power amplifier circuit 68, which acts as a current source to the ETIC 44. In this regard, like the voltage amplifier 36 in the existing ETIC 10, the voltage amplifier 60 also needs to source or sink a high-frequency current $I_{AC}$ (e.g., alternating current) such that the time-variant load current $I_{LOAD}$ can closely track the time-variant power envelope 48.

In an embodiment, the voltage amplifier 60 is configured to generate the sensed signal 58 to reflect an amount of the high-frequency current $I_{AC}$ that is sourced or sunk by the voltage amplifier 60 in accordance with the time-variant power envelope 48. In one embodiment, the sensed signal 58 can be a sensed current $I_{SENSE}$. Accordingly, the time-variant sensed envelope 46 can represent a time-variant current envelope of the high-frequency current $I_{AC}$ that tracks the time-variant power envelope 48 of the RF signal 50. In another embodiment, the sensed signal 58 can be a sensed voltage $V_{SENSE}$ (e.g., converted from the sensed current $I_{SENSE}$). Accordingly, the time-variant sensed envelope 46 can represent a time-variant voltage envelope (e.g., derived from the time-variant current envelope of the high-frequency current $I_{AC}$) that tracks the time-variant power envelope 48 of the RF signal 50.

Figure 4:
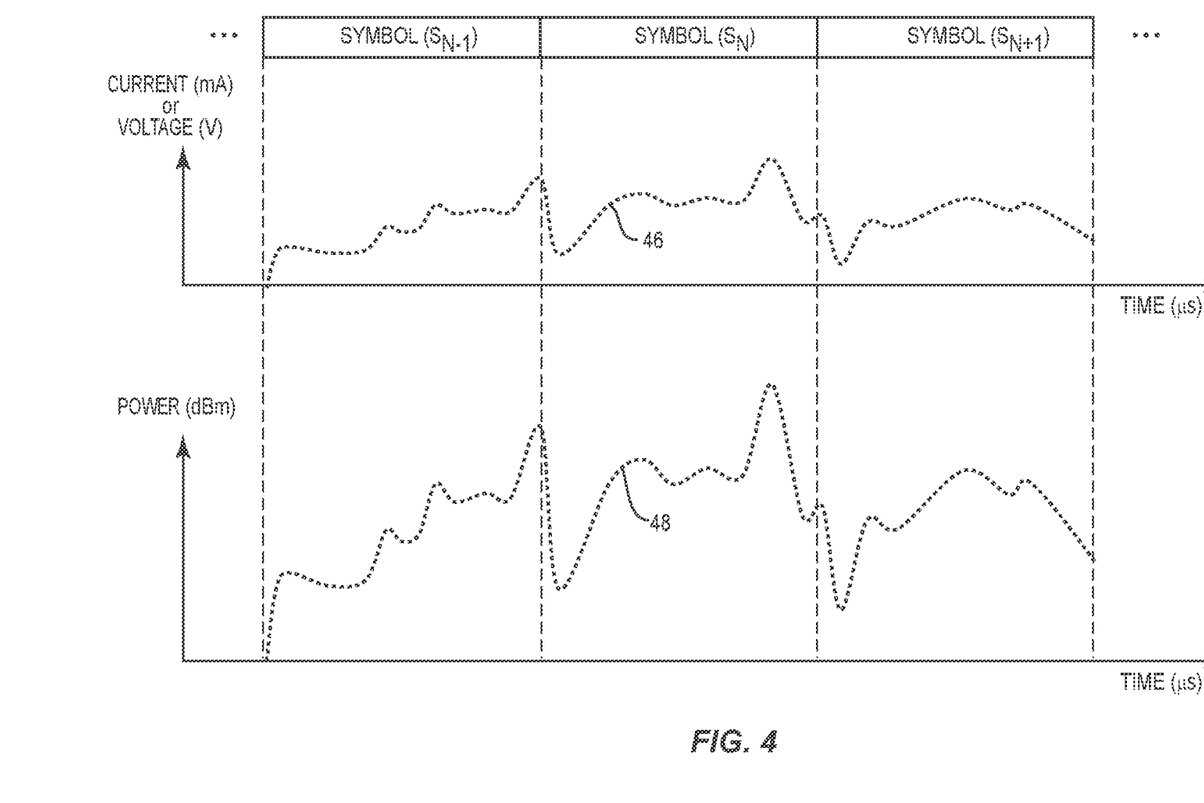
FIG. 4 is a graphic diagram providing an exemplary illustration of the time-variant sensed envelope that closely tracks the time-variant power envelope of the RF signal in FIG. 3.

FIG. 4 is a graphic diagram providing an exemplary illustration of the time-variant sensed envelope 46 that closely tracks the time-variant power envelope 48 of the RF signal 50 in FIG. 3. FIG. 4 illustrates three consecutive symbols $S_{N-1}$, $S_N$, and $S_{N+1}$, which can represent any three consecutive time intervals among the time intervals 56(1)-56(N). As shown, the time-variant sensed envelope 46 is in lock step with the time-variant power envelope 48 in each of the symbols $S_{N-1}$, $S_N$, and $S_{N+1}$. As such, the time-variant sensed envelope 46 can be treated as a replica of the time-variant power envelope 48.

With reference back to FIG. 3, the target voltage generation circuit 54 includes a detection circuit 70 and a voltage selection circuit 72. The detection circuit 70 is configured to detect one or more peaks 74 (shown in FIGS. 5 and 6) of the time-variant sensed envelope 46 in a respective one of the time intervals 56(1)-56(N). As discussed in FIGS. 5 and 6, next, the voltage selection circuit 72 is configured to cause the time-variant target voltage $V_{TGT}$ to increase in response to the detection circuit 70 detecting the peaks in the respective one of the time intervals 56(1)-56(N).

Figure 5:
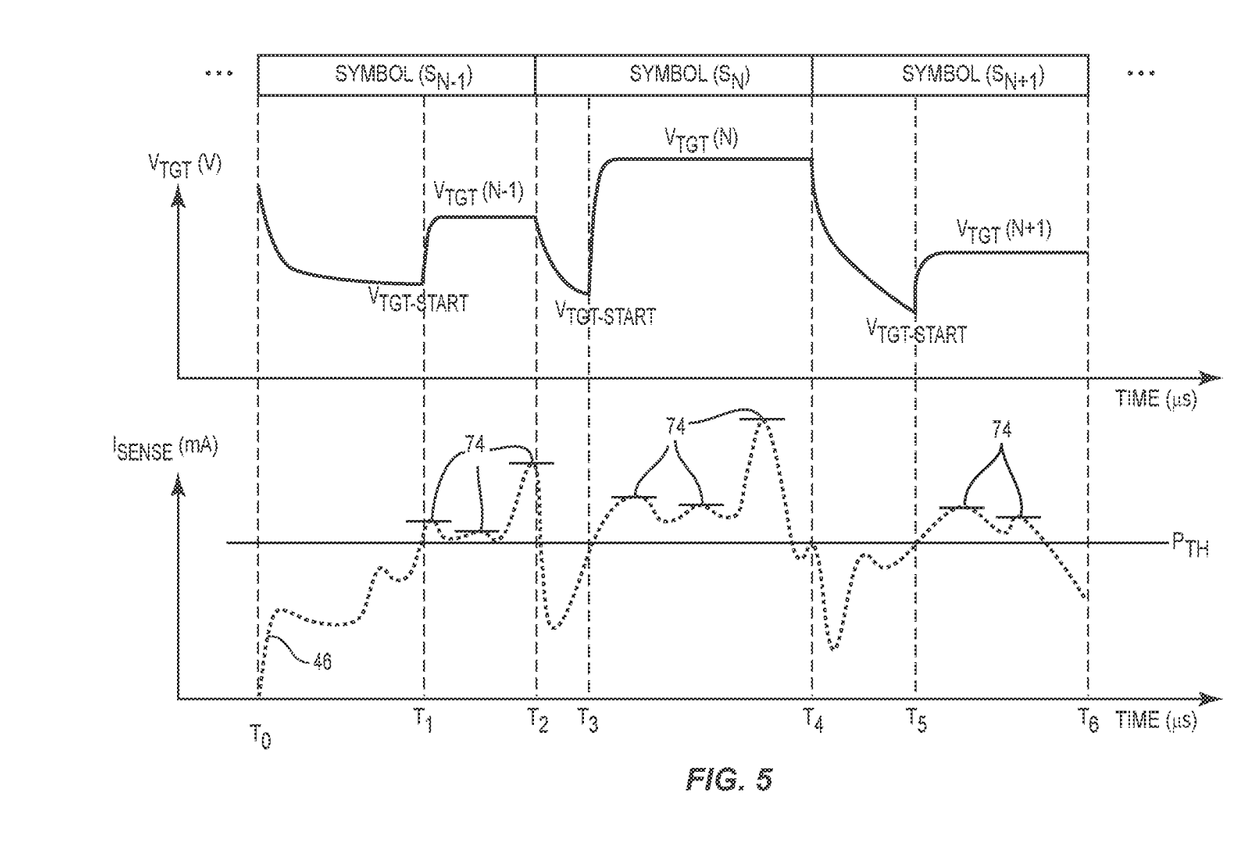
FIGS. 5 and 6 are graphic diagrams providing exemplary illustrations as to how a voltage selection circuit in the ETIC of FIG. 3 can be configured according to embodiments of the present disclosure to generate the time-variant target voltage based on one or more detected peaks in the time-variant sensed envelope in FIG. 4.
Figure 6:
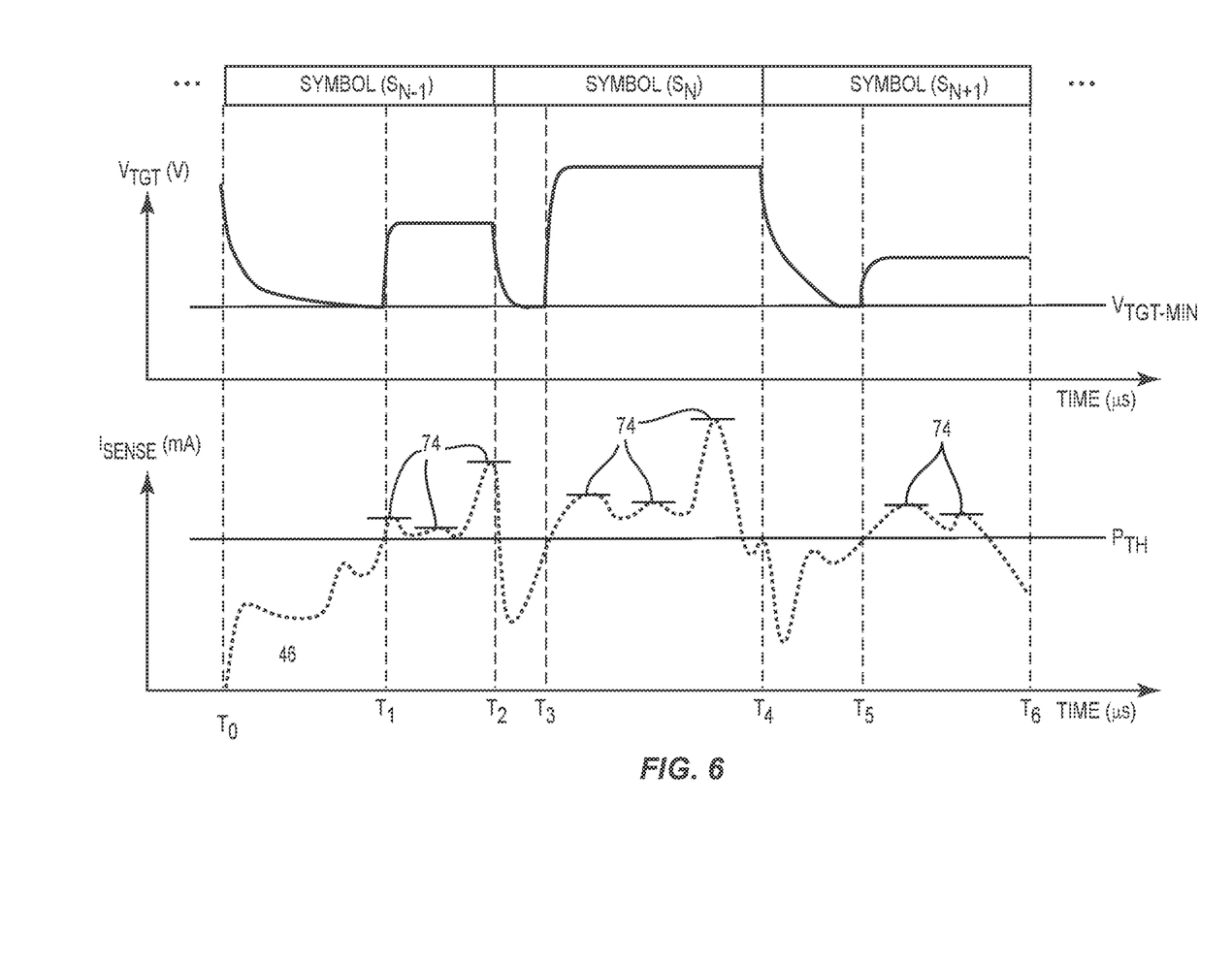

FIGS. 5 and 6 are graphic diagrams providing exemplary illustrations as to how the voltage selection circuit 72 can be configured according to embodiments of the present disclosure to generate the time-variant target voltage $V_{TGT}$ based on the detected peaks 74 in the time-variant sensed envelope 46. Similar to FIG. 4, FIGS. 5 and 6 each illustrate three consecutive symbols $S_{N-1}$, $S_N$, and $S_{N+1}$, which can represent any three consecutive time intervals among the time intervals 56(1)-56(N). Common elements between FIGS. 5 and 6 are shown therein with common element numbers and will not be re-described herein.

With reference to FIG. 5, the detection circuit 70 may be configured to detect each of the peaks 74 in the time-variant sensed envelope 46 in response to the time-variant sensed envelope 46 being higher than a peak detection threshold $P_{TH}$, which can be a function of an average (e.g., root-mean-square (RMS) average) of the time-variant ET voltage $V_{CC}$ across the symbols $S_{N-1}$, $S_N$, and $S_{N+1}$. In a non-limiting example, if the time-variant sensed envelope 46 represents the time-variant current envelope associated with the sensed current $I_{SENSE}$, then the peak detection threshold $P_{TH}$ can be determined based on a programmed RMS level of the time-variant ET voltage $V_{CC}$ and an expected range of load-line impedance value.

At a start of each of the symbols $S_{N-1}$, $S_N$, and $S_{N+1}$, the voltage selection circuit 72 is configured to set the time-variant target voltage $V_{TGT}$ at a starting level $V_{TGT-START}$. In the embodiment illustrated in FIG. 5, the starting level $V_{TGT-START}$ is set by decaying the time-variant target voltage $V_{TGT}$ from a level set at an end of a previous (e.g., immediately preceding) symbol until a first of the peaks 74 (e.g., at time $T_1$, $T_3$, $T_5$) of the time-variant sensed envelope 46 is detected in the symbol. For example, at the start of the symbol $S_N$ (e.g., time $T_2$), the voltage selection circuit 72 is configured to cause the time-variant target voltage $V_{TGT}$ to decay from a previous level $V_{TGT}(N-1)$ set at the end of the preceding symbol $S_{N-1}$ until a first one of the peaks 74 is detected (e.g., at time $T_3$) during the symbol $S_N$. Similarly, at the start of the symbol $S_{N+1}$ (e.g., time $T_4$), the voltage selection circuit 72 is configured to cause the time-variant target voltage $V_{TGT}$ to decay from a previous level $V_{TGT}(N)$ set at the end of the preceding symbol $S_N$ until a first one of the peaks 74 is detected (e.g., at time $T_5$) during the symbol $S_{N+1}$.

Alternatively, as shown in FIG. 6, the voltage selection circuit 72 can set the starting level at the start of the symbols $S_{N-1}$, $S_N$, and $S_{N+1}$ by decaying the time-variant target voltage $V_{TGT}$ from a level set at the end of a previous (e.g., immediately preceding) symbol to a predefined minimum target voltage $V_{TGT-MIN}$.

With reference back to FIG. 5, in response to detecting the first one of the peaks 74 in a respective one of the symbols $S_{N-1}$, $S_N$, and $S_{N+1}$, the voltage selection circuit 72 is configured to cause the time-variant target voltage $V_{TGT}$ to increase from the starting level $V_{TGT-START}$ to a respective one of levels $V_{TGT}(N-1)$, $V_{TGT}(N)$, and $V_{TGT}(N+1)$. Each of the levels $V_{TGT}(N-1)$, $V_{TGT}(N)$, and $V_{TGT}(N+1)$ may be determined as a function of an expected peak-to-average ratio (PAR) in the respective one of the symbols $S_{N-1}$, $S_N$, and $S_{N+1}$. For example, each of the levels $V_{TGT}(N-1)$, $V_{TGT}(N)$, and $V_{TGT}(N+1)$ can be expressed by equation (Eq. 1) below:

$$V_{CC\text{-}RMS} * 10^{(PAR/20)} \quad \text{(Eq. 1)}$$

In the equation (Eq. 1) above, $V_{CC-RMS}$ represents an RMS average of the time-variant ET voltage $V_{CC}$ across the symbols $S_{N-1}$, $S_N$, and $S_{N+1}$ and PAR represents an expected PAR in a respective one of the symbols $S_{N-1}$, $S_N$, and $S_{N+1}$. In a non-limiting example, the time-variant target voltage $V_{TGT}$ can be increased only once in each of the symbols $S_{N-1}$, $S_N$, and $S_{N+1}$.

With reference back to FIG. 3, in an embodiment, the detection circuit 70 can be configured to provide a digital indication signal 76 to the voltage selection circuit 72 in response to detecting the peaks 74 of the time-variant sensed envelope 46 in each of the symbols $S_{N-1}$, $S_N$, and $S_{N+1}$. In a non-limiting example, the digital indication signal 76 can include a coded digital word $D_{Word}$ that indicates the detected peaks 74 of the time-variant sensed envelope 46. In one embodiment, the coded digital word $D_{Word}$ can be a single-bit binary word encoded as one ("1") to indicate that the peaks 74 are detected or zero ("0") to indicate that the peaks 74 are not detected. Understandably, the single-bit binary word is used if the peak detection threshold $P_{TH}$ is the sole threshold used for detecting the peaks 74.

In another embodiment, the coded digital word $D_{Word}$ can be a multi-bit binary word if multiple thresholds are used for detecting the peaks 74. For example, if two peak detection thresholds $P_{THL}$ and $P_{THH}$ ($P_{THH}$>$P_{THL}$) are employed for detecting the peaks 74, then the coded digital word $D_{Word}$ can be a 2-bit binary word. The 2-bit binary word may be encoded as "00," "01," "10," or "11" to indicate respectively that the peaks 74 above both $P_{THH}$ and $P_{THL}$ are not detected, the peaks 74 above both $P_{THH}$ and $P_{THL}$ are detected, the peaks 74 below $P_{THH}$ but above $P_{THL}$ are not detected, or the peaks 74 below $P_{THH}$ but above $P_{THL}$ are detected. It should be appreciated that the multi-bit binary word can help improve granularities in peak detection and target voltage generation.

The voltage selection circuit 72 be configured to generate a time-variant digital target voltage $DV_{TGT}$ based on the coded digital word $D_{Word}$ received in the digital indication signal 76. In a non-limiting example, the voltage selection circuit 72 can convert the coded digital word $D_{Word}$ into the time-variant digital target voltage $DV_{TGT}$ based on a digital LUT. Specifically, the voltage selection circuit 72 can be configured to increase the time-variant digital target voltage $DV_{TGT}$ in response to receiving the coded digital word $D_{Word}$ that indicates the detected peaks 74 of the time-variant sensed envelope 46.

The target voltage generation circuit 54 can further include a digital-to-analog converter (DAC) 78. The DAC 78 is configured to convert the time-variant digital target voltage $DV_{TGT}$ into the time-variant target voltage $V_{TGT}$. In this regard, the voltage selection circuit 72 can cause the time-variant target voltage $V_{TGT}$ to increase by increasing the time-variant digital target voltage $DV_{TGT}$.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (ETIC) comprising:
    an ET voltage circuit configured to:
        generate a time-variant ET voltage based on a time-variant target voltage for amplifying a radio frequency (RF) signal in a plurality of time intervals; and
        generate a sensed signal having a time-variant sensed envelope that tracks a high-frequency current flowing inside the ET voltage circuit and varying in accordance with a time-variant power envelope of the RF signal; and
    a target voltage generation circuit configured to generate the time-variant target voltage based on the time-variant sensed envelope to thereby cause the time-variant ET voltage to track the time-variant power envelope of the RF signal.

2. The ETIC of claim 1, wherein the ET voltage circuit is further configured to generate the sensed signal comprising a sensed current having a time-variant current envelope that tracks the time-variant power envelope of the RF signal.

3. The ETIC of claim 1, wherein the ET voltage circuit is further configured to generate the sensed signal comprising a sensed voltage having a time-variant voltage envelope that tracks the time-variant power envelope of the RF signal.

4. The ETIC of claim 1, wherein the target voltage generation circuit comprises:
    a detection circuit configured to detect one or more peaks of the time-variant sensed envelope in a respective one of the plurality of time intervals; and
    a voltage selection circuit configured to cause the time-variant target voltage to increase in response to the detection circuit detecting the one or more peaks in the respective one of the plurality of time intervals.

5. The ETIC of claim 4, wherein the detection circuit is further configured to detect the one or more peaks of the time-variant sensed envelope in response to the time-variant sensed envelope being higher than a peak detection threshold.

6. The ETIC of claim 5, wherein the peak detection threshold is a function of an average of the time-variant ET voltage.

7. The ETIC of claim 4, wherein the voltage selection circuit is further configured to cause the time-variant target voltage to increase as a function of an expected peak-to-average ratio (PAR) in the respective one of the plurality of time intervals.

8. The ETIC of claim 4, wherein the detection circuit is further configured to provide a digital indication signal to the voltage selection circuit in response to detecting the one or more peaks of the time-variant sensed envelope, the digital indication signal comprising a coded digital word that indicates the one or more detected peaks of the time-variant sensed envelope.

9. The ETIC of claim 8, wherein the voltage selection circuit is further configured to generate a time-variant digital target voltage based on the coded digital word received in the digital indication signal.

10. The ETIC of claim 9, wherein the voltage selection circuit is further configured to increase the time-variant digital target voltage in response to receiving the coded digital word that indicates the one or more detected peaks of the time-variant sensed envelope to thereby cause the time-variant target voltage to increase.

11. The ETIC of claim 9, wherein the target voltage generation circuit further comprises a digital-to-analog converter (DAC) configured to convert the time-variant digital target voltage to the time-variant target voltage.

12. The ETIC of claim 4, wherein the voltage selection circuit is further configured to cause the time-variant target voltage to decay at a start of each of the plurality of time intervals from a level of the time-variant target voltage at an end of an immediately preceding one of the plurality of time intervals.

13. The ETIC of claim 12, wherein the voltage selection circuit is further configured to cause the time-variant target voltage to decay until the one or more peaks of the time-variant sensed envelope are detected.

14. The ETIC of claim 12, wherein the voltage selection circuit is further configured to cause the time-variant target voltage to decay to a predefined minimum target voltage.

15. The ETIC of claim 1, wherein the ET voltage circuit comprises:
 a voltage amplifier configured to generate an initial ET voltage based on the time-variant target voltage; and
 an offset capacitor configured to raise the initial ET voltage by an offset voltage to thereby generate the time-variant ET voltage.

16. The ETIC of claim 15, wherein the voltage amplifier is further configured to:
 source the high-frequency current in response to each peak of the time-variant power envelope; and
 sink the high-frequency current in response to each bottom of the time-variant power envelope.

17. The ETIC of claim 16, wherein the voltage amplifier is further configured to generate the sensed signal to indicate an amount of the high-frequency current that is sourced or sunk by the voltage amplifier.

18. The ETIC of claim 15, further comprising a switcher circuit configured to modulate the offset voltage.

19. The ETIC of claim 18, wherein the switcher circuit comprises:
 a multi-level charge pump (MCP) configured to generate a low-frequency voltage as a function of a battery voltage in accordance with a duty cycle; and
 a power inductor configured to induce a low-frequency current to thereby modulate the offset capacitor to the offset voltage.

20. The ETIC of claim 1, wherein each of the plurality of time intervals has a duration of an orthogonal frequency division multiplexing (OFDM) symbol.

* * * * *

UNITED STATES PATENT AND TRADEMARK OFFICE
CERTIFICATE OF CORRECTION

| | | |
|---|---|---|
| PATENT NO. | : 12,224,711 B2 | Page 1 of 1 |
| APPLICATION NO. | : 17/523966 | |
| DATED | : February 11, 2025 | |
| INVENTOR(S) | : Nadim Khlat | |

It is certified that error appears in the above-identified patent and that said Letters Patent is hereby corrected as shown below:

In the Specification

In Column 4, Line 55, replace "a time-variant variant ET voltage" with --a time-variant ET voltage--.

Signed and Sealed this
Eighteenth Day of March, 2025

Coke Morgan Stewart
*Acting Director of the United States Patent and Trademark Office*